(12) United States Patent
Nagashima

(10) Patent No.: US 8,720,693 B2
(45) Date of Patent: May 13, 2014

(54) SEMICONDUCTOR WAFER STORING CONTAINER

(75) Inventor: Tsuyoshi Nagashima, Tokyo (JP)

(73) Assignee: Miraial Co., Ltd., Tokyo (JP)

( * ) Notice: Subject to any disclaimer, the term of this patent is extended or adjusted under 35 U.S.C. 154(b) by 4 days.

(21) Appl. No.: 13/518,287

(22) PCT Filed: Jan. 26, 2010

(86) PCT No.: PCT/JP2010/050931
§ 371 (c)(1),
(2), (4) Date: Sep. 4, 2012

(87) PCT Pub. No.: WO2011/092799
PCT Pub. Date: Aug. 4, 2011

(65) Prior Publication Data
US 2012/0312720 A1    Dec. 13, 2012

(51) Int. Cl.
*B65D 85/30* (2006.01)
(52) U.S. Cl.
USPC ............................... 206/711; 206/454
(58) Field of Classification Search
USPC .......................... 206/454, 710–712
See application file for complete search history.

(56) References Cited

U.S. PATENT DOCUMENTS 5,611,452 A * 3/1997 Bonora et al. ............. 206/710
7,383,955 B2 * 6/2008 Matsutori et al. ........... 206/711
7,413,099 B2 * 8/2008 Takahashi et al. ........... 206/710
7,648,041 B2 * 1/2010 Ueda et al. ................. 206/710
8,292,081 B2 * 10/2012 Sasaki et al. ............... 206/710

FOREIGN PATENT DOCUMENTS

| JP | 2006-351868 | 12/2006 |
|----|-------------|---------|
| JP | 2007-247870 | 9/2007 |
| JP | 2007-308161 | 11/2007 |
| JP | 2009-277688 | 11/2009 |
| WO | WO 2011-092799 | 4/2011 |

OTHER PUBLICATIONS

Japan Patent Office, International Search Report for PCT Application No. PCT/JP2010/050931, mail date Apr. 20, 2010.
The International Bureau, Notification of the Recording of a Change for PCT Application No. PCT/JP2010/050931, mail date Apr. 3, 2012.

* cited by examiner

*Primary Examiner* — Bryon Gehman
(74) *Attorney, Agent, or Firm* — SoCal IP Law Group LLP; Steven C. Sereboff; John E. Gunther

(57) ABSTRACT

A main body may have a cavity for storing a plurality of parallel semiconductor wafers and an opening for transferring one or more semiconductor wafer into or from the cavity. A covering body may be mounted detachably to the opening in order to close the opening. A gasket may seal between an edge portion of the covering body and an edge portion of the opening. The gasket may be configured such that, when the opening is closed by the covering body, a size of a deformation margin of the gasket is formed to be smaller in a region that seals a vertical edge portion of the opening orthogonal to the face of each semiconductor wafer than in a region that seals a horizontal edge portion of the opening parallel to the face of each the semiconductor wafer.

9 Claims, 6 Drawing Sheets

SEMICONDUCTOR WAFER STORING CONTAINER

RELATED APPLICATIONS

This application is filed under 35 USC 371 as a National Stage of International Application PCT/JP2010/050931, which is incorporated herein by reference.

TECHNICAL FIELD

The present invention relates to a semiconductor wafer storing container.

BACKGROUND ART

Most semiconductor wafer storing containers include a container main body for storing a plurality of semiconductor wafers in a parallel manner therein. An opening for transferring the semiconductor wafers is formed in the container main body. A covering body for blocking the opening for transferring the semiconductor wafers is mounted detachably from outside to the opening for transferring the semiconductor wafers.

In addition, it is necessary to arrange for the semiconductor wafers stored in the container main body not to be contaminated by dust, harmful gas, or the like. Therefore, a gasket is provided that seals between an edge portion of the covering body and an edge portion of the opening for transferring the semiconductor wafers. Then, a gap between the edge portion of the covering body and the edge portion of the opening for transferring the semiconductor wafers is sealed.

Such a gasket is formed as a whole in a ring shape that matches the shape of the edge portion of the opening for transferring the semiconductor wafers. Then, the gasket is sandwiched between the covering body and the container main body and elastically deforms, whereby a gap between the edge portion of the covering body and the edge portion of the opening for transferring the semiconductor wafers is sealed (for example, refer to Japanese Unexamined Patent Application, Publications Nos. 2007-247870 and 2007-308161).

Patent Document 1: Japanese Unexamined Patent Application Publication No. 2007-247870
Patent Document 1: Japanese Unexamined Patent Application Publication No. 2007-308161

DISCLOSURE OF THE INVENTION

Problems to be Solved by the Invention

In the semiconductor wafer storing container as described above, since between the edge portion of the covering body and the edge portion of the opening for transferring the semiconductor wafer is sealed by a gasket, the semiconductor wafer is kept in a state is isolated from the outside environment and not contaminated with dust, harmful gas, or the like.

However, when the covering body is opened to remove semiconductor wafers from the semiconductor wafer storing container, the inside of the container main body is temporarily at negative pressure during a period until the elastically deformed gasket returns back to the original shape, i.e. while the covering body is moving in an opening direction with the gasket keeping its sealing property.

Then, as soon as the covering body is opened up to enter a state in which the gap is no longer sealed by the gasket and the gap is formed between the edge portion of the covering body and the edge portion of the opening for transferring the semiconductor wafer, ambient air is sucked into the container main body through this gap.

When this is done, fine dust and the like adhered to an outer surface of the covering body or gasket may penetrate into the container through the gap due to a fast air flow generated thereby. Then, when such dust adheres to the surface of the semiconductor wafer, the possibility arises that the semiconductor product manufactured with this semiconductor wafer will be defective.

It is an object of the present invention to provide a semiconductor wafer storing container in which an elastic gasket seals between an edge portion of a covering body and an edge portion of an opening for transferring a semiconductor wafer, whereby the semiconductor wafers are not contaminated with dust and the like sucked in from the outside as soon as the covering body is opened.

Means for Solving the Problems

To achieve the above-mentioned object, a semiconductor wafer storing container of the present invention includes: a container main body for storing a plurality of semiconductor wafer in a parallel manner; an opening for transferring a semiconductor wafer into/from a container that is formed in the container main body in an orientation vertical with respect to a face of the semiconductor wafer in a state stored in the container main body; a covering body that is mounted detachably from outside to the opening for transferring a semiconductor wafer in order to block the opening for transferring a semiconductor wafer; and a gasket that seals between an edge portion of the covering body and an edge portion of the opening for transferring a semiconductor wafer by being sandwiched between the covering body and the container main body and elastically deforming, when the covering body is mounted to the opening for transferring a semiconductor wafer, wherein, in a state in which the opening for transferring a semiconductor wafer is closed by the covering body and between the edge portion of the covering body and the edge portion of the opening for transferring a semiconductor wafer is sealed by the gasket, a size of a deformation margin of the gasket is formed to be smaller in a region that seals a vertical edge portion with respect to a face of the semiconductor wafer than in a region that seals a horizontal edge portion with respect to a face of the semiconductor wafer, among the edge portions of the opening for transferring a semiconductor wafer, and wherein the inside and the outside of the container main body enter a communicating state earlier at the vertical edge portion with respect to a face of the semiconductor wafer than at the horizontal edge portion with respect to a face of the semiconductor wafer, among the edge portions of the opening for transferring a semiconductor wafer, when the covering body is moved in a direction in which the opening for transferring a semiconductor wafer opens.

Furthermore, the opening for transferring a semiconductor wafer may be formed in a substantially rectangular shape. Then, a size of deformation margin of the gasket may be formed to be smaller only in an intermediate region of the vertical edge portion with respect to a face of the semiconductor wafer. Furthermore, the size of the deformation margin of the gasket may be formed to be smaller in a region of 30 to 80% of the vertical edge portion with respect to a face of the semiconductor wafer, than other regions of the edge portion of the opening for transferring a semiconductor wafer.

Furthermore, the size of the deformation margin of the gasket may be formed to be smaller in a portion at which at least one edge portion among two vertical edge portions with respect to a face of the semiconductor wafer is sealed than in a portion at which a horizontal region with respect to the semiconductor wafer is sealed.

Furthermore, the gasket may be formed as a whole in a ring shape and may be mounted to the covering body so that a portion of an inner edge side of the gasket is air tight with respect to the covering body, and the gasket elastically deforms by a portion of an outer edge side of the gasket being pressed against the container main body in a closing direction of the covering body. Additionally, the portion of the outer edge side of the gasket may be formed in a peak shape that protrudes obliquely toward the container main body.

In this case, a protruding length of the portion of the peak shape of the gasket may be formed to be constant over the entire circumference, and an amount of the deformation margin may be defined by changing an inclination angle of the portion of the peak shape according to location. Alternatively, an inclination angle of the portion of the peak shape in the gasket may be formed to be constant over the entire circumference, and an amount of the deformation margin may be defined by changing the protruding length of the portion of the peak shape according to location.

Effects of the Invention

According to the present invention, when the covering body is opened, the inside and the outside of the container main body enter a communicating state earlier at the vertical edge portion with respect to a face of the semiconductor wafer than at the horizontal edge portion with respect to a face of the semiconductor wafer, among the edge portions of the opening for transferring a semiconductor wafer. As a result, dust and the like sucked in from outside at this moment fall on the bottom of the container main body without touching a surface of the semiconductor wafer, and thus the semiconductor wafer is not contaminated with dust and the like.

PREFERRED MODE FOR CARRYING OUT THE INVENTION

Figure 1:
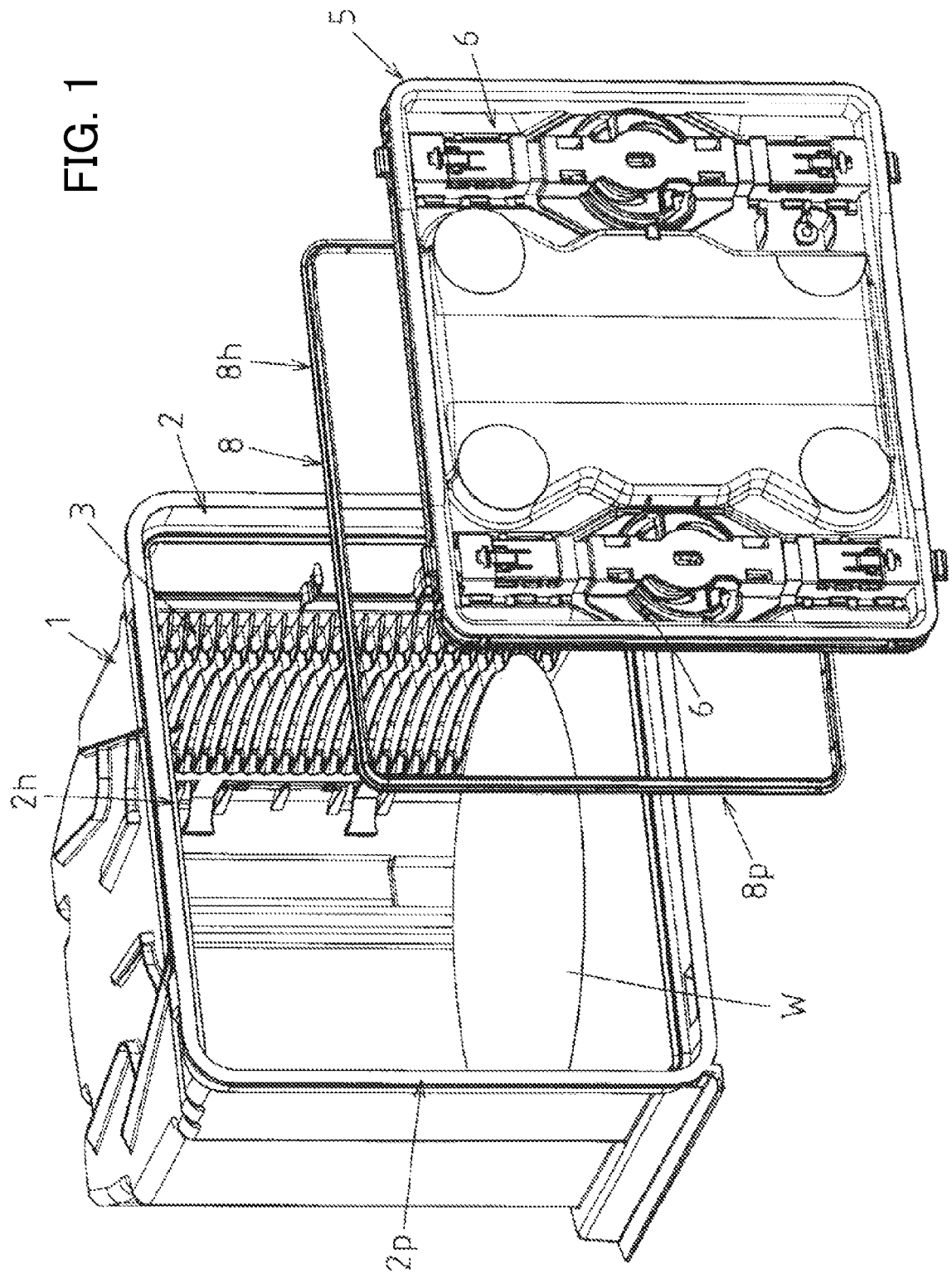
FIG. 1 is a perspective view showing an overall configuration of a semiconductor wafer storing container according to a first embodiment of the present invention.

Embodiments of the present invention are explained with reference to the drawings in the following. FIG. 1 shows an overall configuration of a semiconductor wafer storing container. Reference numeral 1 refers to a container main body for storing a plurality of semiconductor wafers W in a parallel manner. Only a single semiconductor wafer W is shown in the drawing.

At a front lateral side (front side) of the container main body 1, an opening 2 for transferring a semiconductor wafer into/from a container is formed in a vertical direction with respect to a face of the semiconductor wafer W in a state being stored in the container main body 1. The opening 2 for transferring a semiconductor wafer is formed in a substantially rectangular shape.

The plurality of semiconductor wafers W is stored in the container main body 1 so that each with the axis line aligned horizontally and spaced apart at a constant interval. Reference numeral 3 is a wafer retaining groove provided inside the container main body 1 for retaining each semiconductor wafer W in this way.

Reference numeral 5 is a covering body that is mounted detachably to the opening 2 for transferring a semiconductor wafer from outside in order to close the opening for transferring a semiconductor wafer 2. The covering body 5 is formed in a substantially rectangular shape that matches the shape of the opening 2 for transferring a semiconductor wafer. A retainer for retaining the plurality of semiconductor wafers W in a state of being elastically pushed inside of the container main body 1 is provided at an inner wall portion of the covering body 5. However, the retainer is not illustrated in the drawings.

A pair of manual latch mechanisms 6 for maintaining a state in which the opening 2 for transferring a semiconductor wafer is closed is provided at the covering body 5. When the latch mechanism 6 is operated to release the engagement with the covering body 5 and the container main body 1, the covering body 5 enters a detachable state relative to the opening 2 for transferring a semiconductor wafer.

Reference numeral 8 is a gasket that seals a gap between an outer edge portion of the covering body 5 and an inner edge portion of the opening 2 for transferring a semiconductor wafer when the covering body 5 is in a state attached to the opening 2 for transferring a semiconductor wafer. The gasket 8 as a whole is formed in a substantially oblong ring shape to match the shape of the edge portion of the covering body 5 and the end portion of the opening 2 for transferring a semiconductor wafer.

The gasket 8 formed from an elastic material is elastically deformed by being sandwiched between the covering body 5 and the container main body 1 when the covering body 5 is in a state attached to the opening for transferring a semiconductor wafer 2. In this way, the gap between the edge portion of the covering body 5 and the edge portion of the opening 2 for transferring a semiconductor wafer enters a sealed state.

Figure 2:
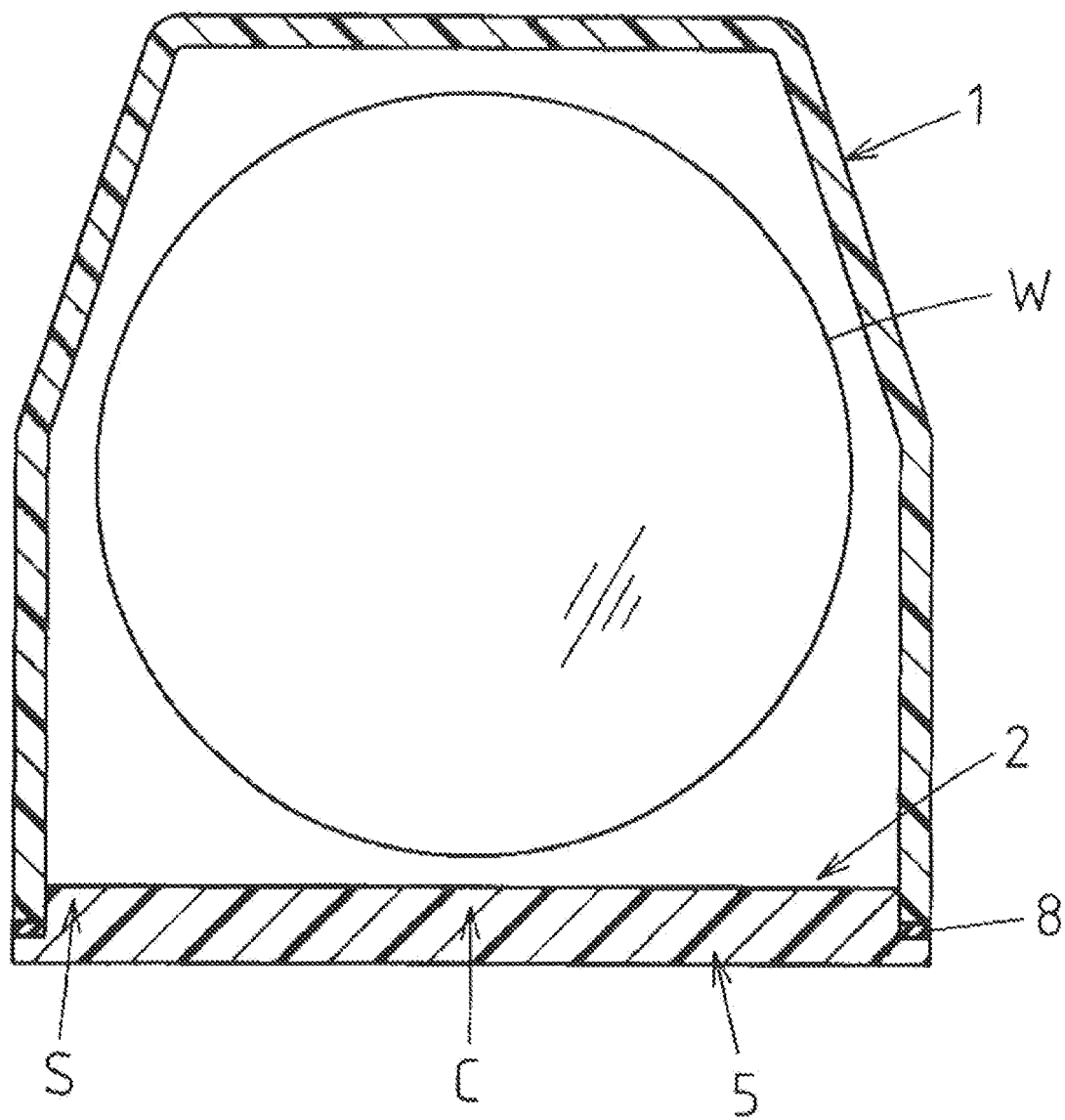
FIG. 2 is a plane cross-sectional view of the semiconductor wafer storing container according to the first embodiment of the present invention.

FIG. 2 is a plane cross-sectional view schematically showing a semiconductor wafer storing container in a state in which the semiconductor wafer W is stored in the container main body 1. However, illustrations of the wafer retaining groove 3 and the like are omitted. An outer edge of the semiconductor wafer W formed in a disk shape is arranged very close to the covering body 5 in the proximity of a center position C of the opening 2 for transferring a semiconductor wafer, while being arranged to be separated from the covering body 5 at sides of both right and left end portions S of the opening 2 for transferring a semiconductor wafer.

Therefore, when dust and the like are sucked into the container main body 1 from the gap between the edge portion of the covering body 5 and the edge portion of the opening 2 for transferring a semiconductor wafer in the proximity of the center position C of the opening 2 for transferring a semiconductor wafer, it is highly likely that the dust fall on the surface of the semiconductor wafer W and adhered there.

However, when dust and the like are sucked into the container main body 1 from the gap between the edge portion of the covering body 5 and the edge portion of the opening 2 for transferring a semiconductor wafer in the proximity of the both end portions S of the opening 2 for transferring a semiconductor wafer, it is highly likely that the dust will fall on the bottom of the container main body 1 without touching the surface of the semiconductor wafer W.

Therefore, by devising the shape of the gasket 8 in the semiconductor wafer storing container of the present invention, when the covering body 5 that closes the opening 2 for transferring a semiconductor wafer is opened, the inside and the outside of the container main body 1 initially communicate from both end portions S of the opening 2 for transferring a semiconductor wafer so that the flow of air that sucks in dust is not generated in the proximity of the center position C of the opening 2 for transferring a semiconductor wafer. The contents thereof are explained in the following.

Figure 3:
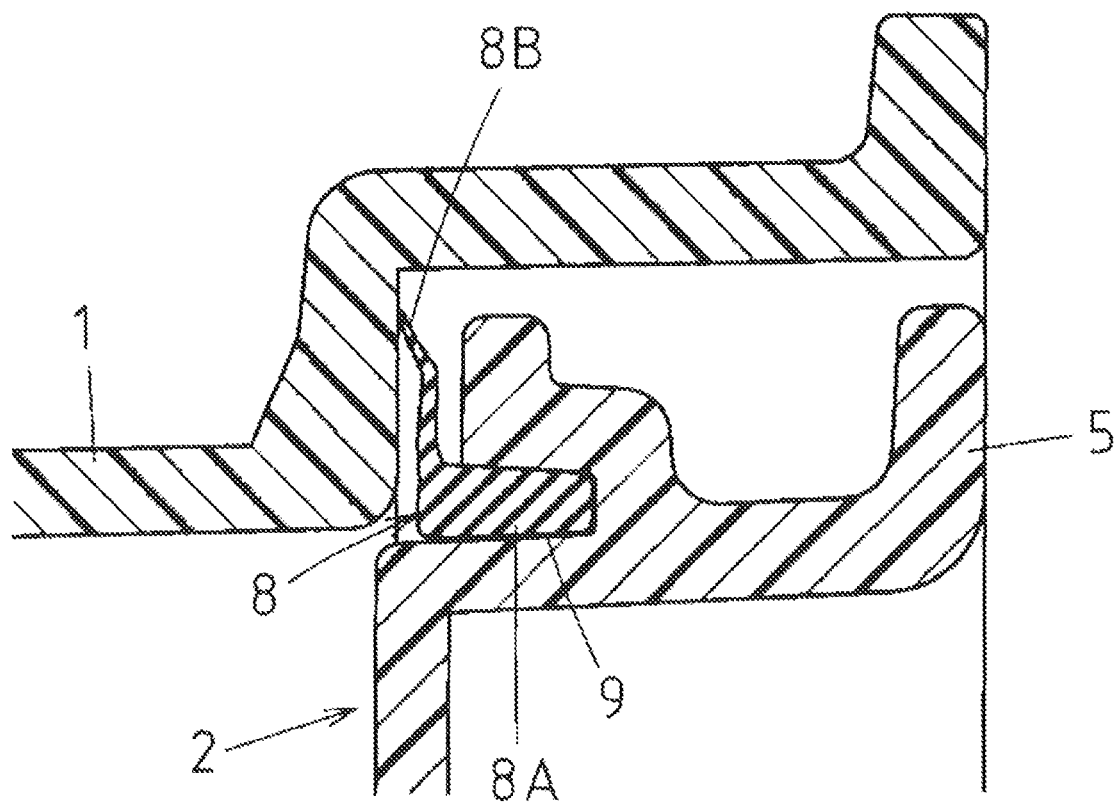
FIG. 3 is a partial cross-sectional view of the semiconductor wafer storing container according to the first embodiment of the present invention, in a state in which a covering body is closed.

FIG. 3 is a partial cross-sectional view showing a state in which the covering body 5 is mounted to the opening 2 for transferring a semiconductor wafer of the container main body 1, and the gap between the edge portion of the covering body 5 and the edge portion of the opening 2 for transferring a semiconductor wafer are sealed by means of the gasket 8. In a state in which the opening 2 for transferring a semiconductor wafer is closed by the covering body 5, the gasket 8 enters the state shown in FIG. 3 at the entire circumference.

In other words, a portion at the inner edge side of the gasket 8 formed in a ring shape as a whole is fit in an air tight manner into a fitting groove 9 formed in the covering body 5 over the entire circumference. Reference numeral 8A refers to an inner-edge-side fitting portion. On the other hand, a portion at the outer edge side of the gasket 8 is formed in a peak shape so as to protrude obliquely outwards from the inner-edge-side fitting portion 8A towards the container main body 1. Reference numeral 8B refers to the peak shape portion (peaked portion).

The peaked portion 8B is pushed from the covering body 5 to the container main body 1 in a closing direction of the covering body 5, and elastically deforms. In this way, the gap between the edge portion of the covering body 5 and the edge portion of the opening 2 for transferring a semiconductor wafer is sealed over the entire circumference.

However, the size of the deformation margin of the gasket 8 in this state (i.e. the amount of elastic deformation of the gasket 8 in the open-close direction of the covering body 5) is formed, in the edge portions of the opening 2 for transferring a semiconductor wafer, to be smaller at a vertical portion ($8p$), which seals a vertical edge portion ($2p$) with respect to the surface of the semiconductor wafer W, than at a horizontal portion ($8h$), which seals a horizontal edge portion ($2h$ shown in FIG. 1) with respect to the surface of the semiconductor wafer W.

In other words, as shown in FIGS. 4(A) and (B), in a state in which the covering body 5 is separated from the opening 2 for transferring a semiconductor wafer and the gasket 8 returns to the original shape, a protruding length (peak length) of the peak shape portion 8B of the gasket 8 is formed to be constant over the entire circumference, and an inclination angle of the peak shape portion 8B is changed according to location. In this way, the deformation margin Xp of the peak shape portion 8B at the vertical portion $8p$ of the gasket 8 is formed to be smaller than the deformation margin Xh of the peak shape portion 8B at the horizontal portion $8h$ of the gasket 8. The relationship is the deformation margin Xp<the deformation margin Xh.

However, it is not necessary for the entire vertical portion $8p$ of the peak shape portion 8B to be formed to have the smaller deformation margin Xp. For example, it is sufficient for a range on the order of at least 30% of the vertical portion $8p$ to be formed with the smaller deformation margin Xp. Furthermore, it may be desirable from the viewpoint of maintaining the reliability of sealing for the deformation margin not to be made smaller at the portions close to the four corners of the gasket 8 that is formed as a whole in a rectangular shape.

Figure 5:
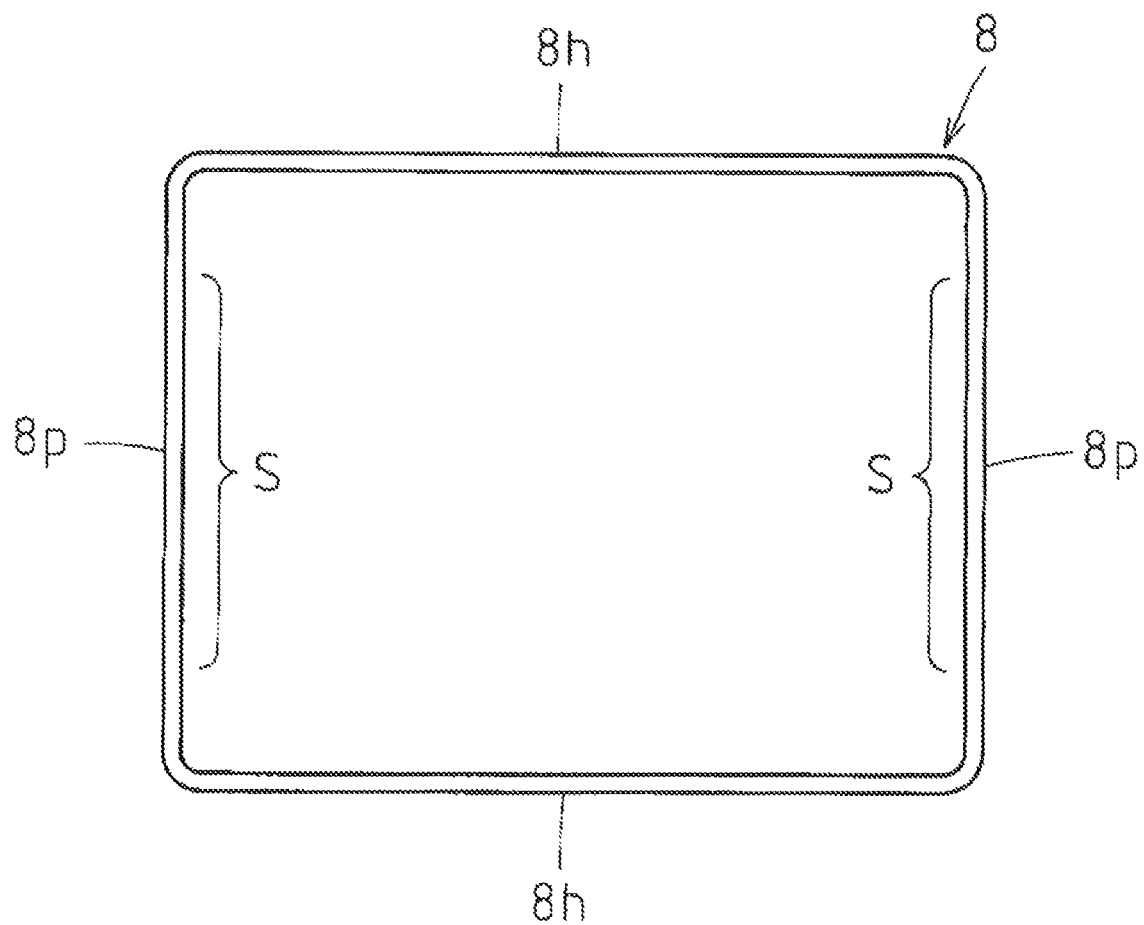
FIG. 5 is a front elevation view of a gasket of the semiconductor wafer storing container according to the first embodiment of the present invention.

As a result, as in the front elevation view of the gasket 8 shown in FIG. 5, it is sufficient for the region S in which the deformation margin is small of the vertical portion $8p$ of the gasket 8 to be formed in a range on the order of 30 to 80% in the center thereof. Furthermore, it is sufficient for a region having a smaller deformation margin to be formed in least at either one among the two vertical portions $8p$ of the gasket 8.

Figure 4:
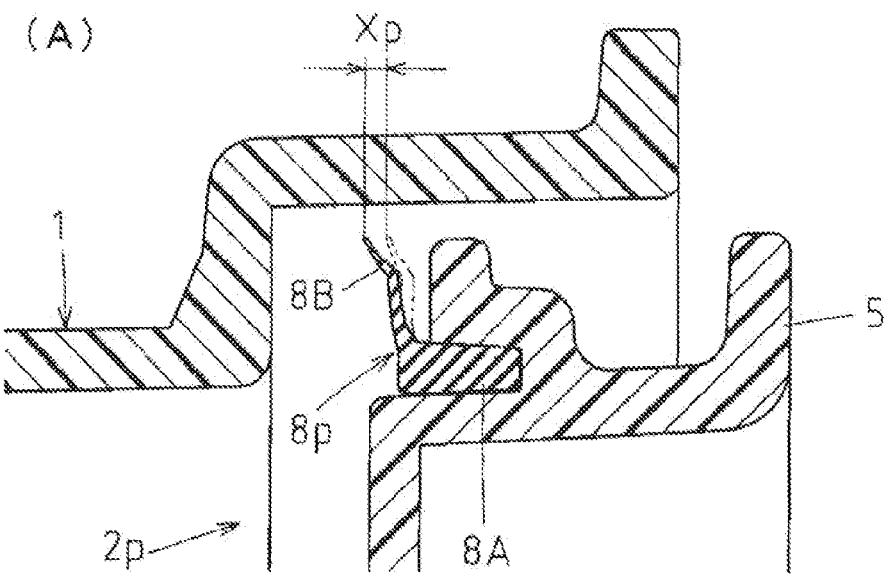
FIG. 4 is a partial cross-sectional view of the semiconductor wafer storing container according to the first embodiment of the present invention, in a state in which a covering body is opened ((A) shows a vertical end portion and (B) shows a horizontal end portion)
Figure 4:
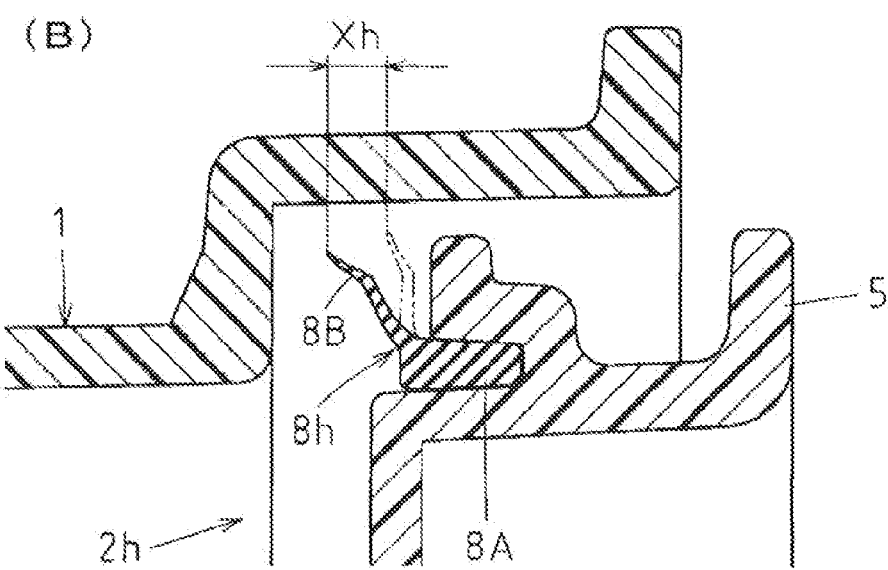

In the semiconductor wafer storing container of the embodiment configured in this way, when the covering body 5 is moved in the direction in which the opening 2 for transferring a semiconductor wafer opens as shown in FIG. 4, from the state in which the covering body 5 blocks the opening 2 for transferring a semiconductor wafer of the container main body 1 as shown in FIG. 3, the sealing property of the gasket 8 is lost earlier at the vertical edge portion $2p$ than at the horizontal edge portion $2h$ of the opening 2 for transferring a semiconductor wafer. Then, the inside and the outside of the container main body 1 enter a communicating state.

Therefore, a flow of air that sucks in dust adhered on the outer surface and the like of the covering body 5 or the gasket 8 is not generated at the horizontal edge portion $2h$ of the opening 2 for transferring a semiconductor wafer, and the dust and the like may be sucked into the container main body 1 from the vertical edge portion $2p$. However, such dust falls on the bottom of the container main body 1 without touching the surface of the semiconductor wafer W.

Figure 6:
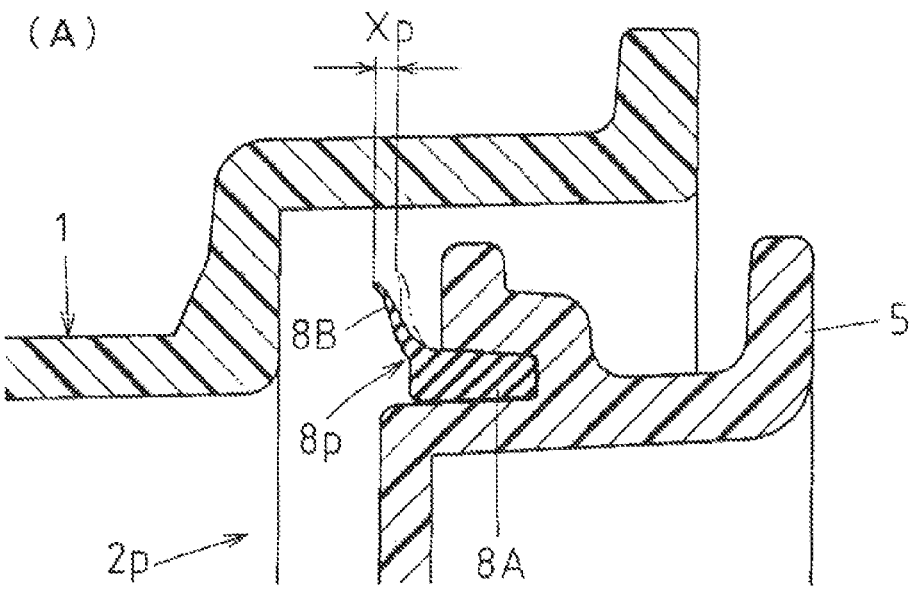
FIG. 6 is a partial cross-sectional view of the semiconductor wafer storing container according to a second embodiment of the present invention, in a state in which a covering body is opened ((A) shows a vertical end portion and (B) shows a horizontal end portion).
Figure 6:
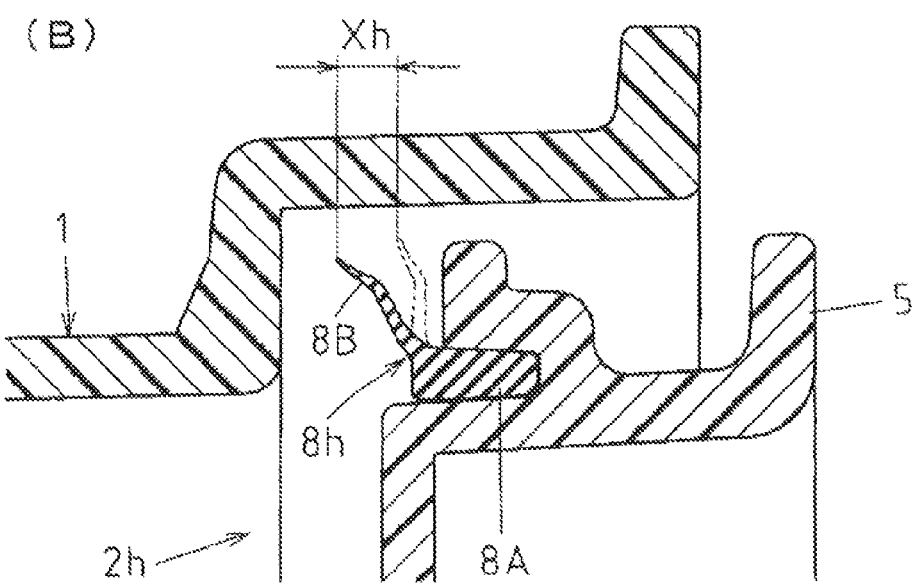

It should be noted that the present invention is not limited to the abovementioned embodiment. For example, as in a second embodiment shown in FIG. 6, the inclination angle of the peaked shape portion 8B of the gasket 8 is formed to be constant over the entire circumference, and the amount of the deformation margins Xh and Xp may be defined by changing the protruding length (peak length) of the peak shape portion 8B according to location. Furthermore, the amount of the deformation margins Xh and Xp may be defined by changing the hardness or thickness of the peak shape portion 8B.

Furthermore, the sizes of the deformation margins of the gasket 8 are not necessarily identical in the entire region of the horizontal edge portion $2h$ of the opening 2 for transferring a semiconductor wafer. That is, the deformation margin of the gasket 8 may be made smaller at a region other than the horizontal edge portion $2h$, compared to the portion close to the center of the horizontal edge portion $2h$.

Furthermore, although a pair of the horizontal edge portions $2h$ lies at the upper and lower sides of the opening 2 for transferring a semiconductor wafer, a deformation margin at the lower side of the gasket 8 can be made smaller than that at the upper side thereof. This is because, even if dust is sucked in from the horizontal edge portion $2h$ that is located at the lower side, if this dust will fall on the bottom of the container main body 1, the dust will not negatively influence the semiconductor wafer W.

Furthermore, the present invention may be applied to a semiconductor wafer storing container in which a plurality of semiconductor wafers W is stored standing vertically and aligned concentrically in the container main body 1. In this case, it may be configured such that the inside and the outside of the container main body 1 first communicate with each other at an edge portion on the lower side of the opening 2 for transferring a semiconductor wafer of a rectangular shape.

Furthermore, in each of the abovementioned embodiments, the gasket 8 is fit into the covering body 5 and pressed against the container main body 1. On the contrary, however, it is a configuration in which the gasket 8 is mounted to the container main body 1 and the gasket 8 is pressed against the covering body 5.

Moreover, in each of the abovementioned embodiments, it is configured so that the deformation margin differs according to location, by changing a cross sectional shape of the gasket 8. However, it may be configured so that the deformation margin of the gasket 8 differs according to location by changing the location of a face (height of a face) of the container main body 1 or the covering body 5 against which the gasket 8 is pressed, without changing a cross sectional shape of the gasket 8.

EXPLANATION OF REFERENCE NUMERALS

1 container main body
2 opening for transferring a semiconductor wafer
2h horizontal end portion (an end portion that is horizontal with respect to a face of a semiconductor wafer)
2p vertical edge portion (edge portion that is vertical with respect to a face of a semiconductor wafer)
5 covering body
8 gasket
8A inner-edge-side fitting portion
8B peak shape portion
8h horizontal portion
8p vertical portion
W semiconductor wafer
Xh, Xp deformation margin of gasket

The invention claimed is:

1. A semiconductor wafer storing container comprising:
   a container main body including
      a cavity for storing a plurality of semiconductor wafers in a parallel manner and,
      an opening for transferring one or more semiconductor wafers into or from the cavity, the opening lying in a plane orthogonal to a face of each semiconductor wafer stored in the cavity;
   a covering body configured to be mounted detachably from outside to the opening in order to close the opening; and
   a gasket that, when the opening is closed by the covering body, seals between an edge portion of the covering body and an edge portion of the opening by being sandwiched between the covering body and the container main body and elastically deforming,
   wherein the gasket is configured such that, when the opening is closed by the covering body and the edge portion of the covering body and the edge portion of the opening are sealed by the gasket, a size of a deformation margin of the gasket is formed to be smaller in a region that seals a vertical edge portion of the opening orthogonal to the face of each semiconductor wafer than in a region that seals a horizontal edge portion of the opening parallel to the face of each semiconductor wafer,
   whereby, when the covering body is moved in a direction away from the container main body to cause the opening to open, air flows between the inside and the outside of the cavity at the vertical edge portion before air flows between the inside and the outside of the cavity at the horizontal edge portion.

2. The semiconductor wafer storing container according to claim 1,
   wherein the opening is formed in a substantially rectangular shape.

3. The semiconductor wafer storing container according to claim 2,
   wherein the size of the deformation margin of the gasket is formed to be smaller only in an intermediate region of the vertical edge portion.

4. The semiconductor wafer storing container according to claim 3, wherein
   the size of the deformation margin of the gasket is formed to be smaller in a region of 30 to 80% of the vertical edge portion, than other regions of the edge portion of the opening.

5. The semiconductor wafer storing container according to claim 2,
   wherein the size of the deformation margin of the gasket is formed to be smaller in a portion at which at least one edge portion among two vertical edge portions of the opening is sealed than in a portion at which a horizontal region is sealed.

6. The semiconductor wafer storing container according to claim 1,
   wherein the gasket is formed as a whole in a ring shape, and is mounted to the covering body so that a portion of an inner edge side of the gasket is air tight with respect to the covering body, and the gasket elastically deforms by a portion of an outer edge side of the gasket being pressed against the container main body in a closing direction of the covering body.

7. The semiconductor wafer storing container according to claim 6,
   wherein the portion of the outer edge side of the gasket is formed in a peak shape that protrudes obliquely toward the container main body.

8. The semiconductor wafer storing container according to claim 7,
   wherein a protruding length of a portion of the peak shape in the gasket is formed to be constant over the entire circumference, and an amount of the deformation margin is defined by changing an inclination angle of the portion of the peak shape according to location.

9. The semiconductor wafer storing container according to claim 7,
   wherein an inclination angle of the portion of the peak shape in the gasket is formed to be constant over the entire circumference, and an amount of the deformation margin is defined by changing the protruding length of the portion of the peak shape according to location.

* * * * *